US010790850B1

(12) United States Patent
Lin et al.

(10) Patent No.: US 10,790,850 B1
(45) Date of Patent: Sep. 29, 2020

(54) SIGNAL AMPLITUDE AWARE DITHERING METHOD FOR ENHANCING SMALL SIGNAL LINEARITY IN AN ANALOG-TO-DIGITAL CONVERTER

(71) Applicant: NXP B.V., Eindhoven (NL)

(72) Inventors: Yu Lin, Eindhoven (NL); Vladislav Dyachenko, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/456,365

(22) Filed: Jun. 28, 2019

(51) Int. Cl.
*H03M 1/20* (2006.01)
*H03M 3/00* (2006.01)
*H03M 1/46* (2006.01)

(52) U.S. Cl.
CPC ............. *H03M 3/33* (2013.01); *H03M 1/462* (2013.01); *H03M 3/424* (2013.01)

(58) Field of Classification Search
CPC ........ H03M 3/33; H03M 1/462; H03M 3/424; H03M 3/332
USPC ........................................ 341/144, 155, 143
See application file for complete search history.

(56) References Cited

U.S. PATENT DOCUMENTS

| | | | |
|---|---|---|---|
| 6,326,911 B1 | 12/2001 | Gomez et al. | |
| 6,351,229 B1 * | 2/2002 | Wang | H03M 3/332 341/131 |
| 7,015,851 B1 | 3/2006 | Bruhns et al. | |
| 9,331,709 B2 | 5/2016 | Steensgaard-Madsen | |
| 10,218,421 B2 * | 2/2019 | Gustavsson | H04B 7/0469 |
| 2011/0131264 A1 * | 6/2011 | Hars | G06F 7/588 708/254 |

OTHER PUBLICATIONS

AN-804 Improving A/D Converter Performance Using Dither, online available: http://www.ti.com.cn/cn/lit/an/snoa232/snoa232.pdf.
S. P. Lipshitz, R. A. Wannamaker, and J. Vanderkooy, "Quantization and Dither: A Theoretical Survey," JAES, vol. 40, No. 5, pp. 355-375, May 1992.
A. Eielsen and A. J. Fleming, "Improving Digital-to-Analog Converter Linearity by Large High-Frequency Dithering," IEEE Transactions on Circuits and Systems I: Regular Papers, vol. 64, No. 6, pp. 1409-1420, Jun. 2017.

(Continued)

*Primary Examiner* — Peguy Jean Pierre

(57) ABSTRACT

An analog-to-digital converter (ADC) and a method are disclosed. The ADC includes dithering circuitry. The dithering circuitry includes a signal level detector, a dither amplitude controller, a random code generator, and a dither digital-to-analog converter (DAC). The signal level detector receives the analog input signal and provides amplitude level information associated with the analog input signal. The dither amplitude controller receives the amplitude level information from the signal level detector, and provides a control signal. The dither amplitude controller varies the control signal based on the amplitude level information. The dither DAC receives the control signal from the dither amplitude controller and a pseudo-noise (PN) signal from the random code generator, and provides the dither signal based on the control signal. The dither signal varies based on an amplitude level of the analog input signal.

20 Claims, 7 Drawing Sheets

(56) References Cited

OTHER PUBLICATIONS

L. He, L. Jin, J. Yang, F. Lin, L. Yao, and X. Jiang, "Self-Dithering Technique for High-Resolution SAR ADC Design," IEEE Transactions on Circuits and Systems II: Express Briefs, vol. 62, No. 12, pp. 1124-1128, Dec. 2015.

Ghosh and S. Pamarti, "A 50MHz bandwidth, 10-b ENOB, 8.2mW VCO-based ADC enabled by filtered-dithering based linearization," in Proceedings of the IEEE 2013 Custom Integrated Circuits Conference, 2013, pp. 1-4.

* cited by examiner

SIGNAL AMPLITUDE AWARE DITHERING METHOD FOR ENHANCING SMALL SIGNAL LINEARITY IN AN ANALOG-TO-DIGITAL CONVERTER

FIELD OF THE DISCLOSURE

The present disclosure relates generally to data conversion between an analog form and a digital form and more specifically relates to dithering control based on a signal amplitude for a data conversion circuit.

BACKGROUND OF THE DISCLOSURE

High performance automotive radar sensors need a data conversion circuit, such as an analog-to-digital converter (ADC) or digital-to-analog converter (DAC), to have an ultra-low spur level to avoid false alarms and/or missed detection of targets with small radar cross sections. However, circuit component mismatches in an ADC, e.g. successive approximation register (SAR) ADCs, may prevent the ADC from achieving the desired low spurs level. For example, in a radar system, an ADC may have non-ideal transfer function due to signal dependent offsets, components mismatches and memory effects that may prevent achieving the low spurs level as needed.

Dithering is a technique to improve the linearity of the ADC, such that the low spurs level may be accomplished. For example, dithering may add a pseudo random noise signal to an input signal, and as a result mismatch and memory induced conversion errors within the ADC may be decorrelated with the input signal by the added noise. The noise introduced by dither can be subtracted from the ADC output when conversion is finished since the dither amplitude is known exactly.

However, while conventional dithering techniques may improve the linearity of an ADC, these techniques have a drawback of reducing the effective input range of an ADC. In an example, the ADC's effective input range may be defined as a maximum amplitude of an analog input signal that the ADC may process without clipping the signal. In certain examples, the effective range of the ADC may be reduced so that the ADC can accommodate the sum of the input signal plus the dither signal while avoiding clipping of the signal, and thus a small dither signal is desirable. However, the dither signal needs to be sufficiently large to be effective. Thus, a technique that avoids such disadvantages of reducing the ADC's effective input range while enabling dithering of the ADC would be a technological improvement over existing technology.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

Analog-to-digital converter (ADC) circuitry and a method are disclosed. The ADC circuitry includes an ADC and dithering circuitry. The dithering circuitry includes a signal level detector, a dither signal amplitude controller, PN code generator and a dither digital-to-analog converter (DAC). The signal level detector receives an analog input signal and provides amplitude level information associated with the analog input signal. In an example, the signal level detector may determine a coarse estimation of analog input signal level and provide a coarse estimation of the analog input signal level. The dither amplitude controller may receive the amplitude level information from the signal level detector, and provide a control signal. In an example, the dither amplitude controller may vary the control signal based on the amplitude level information. The dither DAC may receive the control signal from the dither amplitude controller and the PN code generator, and provide a dither signal based on the control signal and the PN code generator, such that the dither signal varies based on an amplitude level of the analog input signal.

The ADC circuitry disclosed herein with dithering control based on an analog input signal amplitude provides various advantages and benefits over other systems that utilize ADCs. In particular, the ADC circuitry may determine a signal level of an analog input signal and vary the root mean square (RMS) amplitude of a dither signal for the ADC based on the signal level to improve a dynamic range of the ADC and improve small signal linearity of the ADC. In an example, the dithering signal may have a varying amplitude over time, such that the strength (e.g., RMS amplitude or peak amplitude) of the dither signal within a certain period of time is varying based on a signal level of the analog input signal. For example, in response to the analog input signal having a small amplitude, the ADC circuitry, such as a dithering controller within the ADC circuitry, may provide a dither signal with large RMS amplitude value to the ADC to improve the linearity of the ADC with low amplitude analog input signals. However, in response to the analog input signal having a large amplitude, the RMS amplitude of the dither signal may be reduced or not provided to the ADC, such that the input range of the ADC is not exceeded by the combination of the dither signal and the analog input signal with a large amplitude. While previous ADCs utilize dither signals to improve ADC linearity, these ADCs provide a dither signal with constant RMS amplitude and thereby reduce a dynamic range of the ADC based on the combination of the dither signal and the input analog input signal. Therefore, the systems disclosed herein improve the linearity of the ADC circuitry without degrading the effective input range of the ADC circuitry via varying the RMS amplitude of a dither signal within a certain period of time based on a signal level of the analog input signal.

Figure 1:
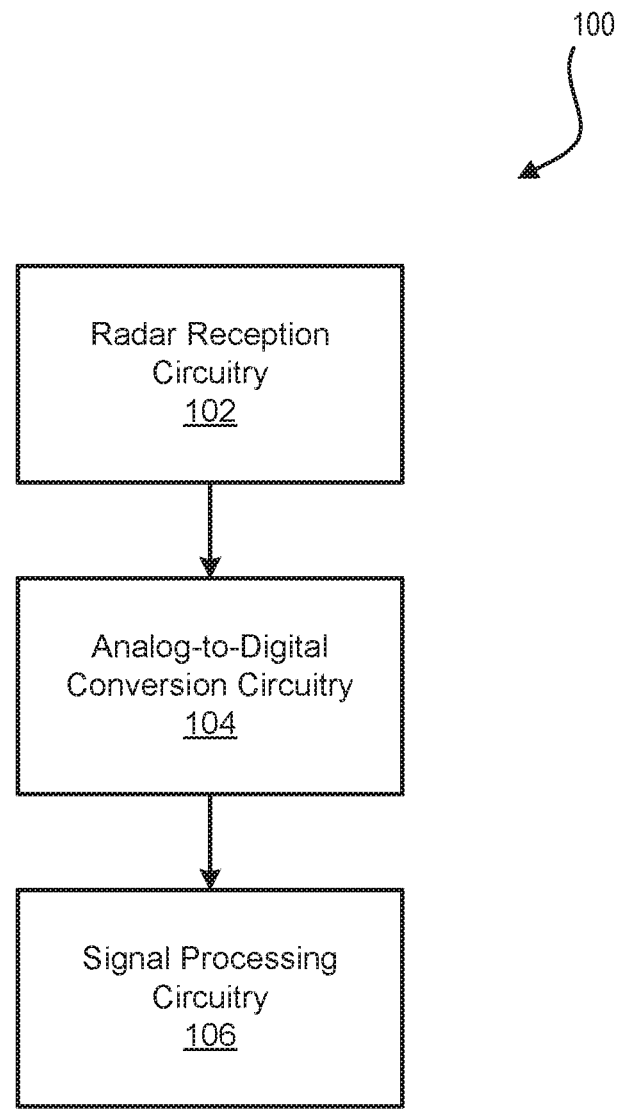
FIG. 1 is a block diagram illustrating a portion of automotive circuitry in accordance with at least one embodiment.

FIG. 1 is a block diagram illustrating a portion of automotive circuitry 100. Automotive circuitry 100 includes radar reception circuitry 102, analog-to-digital conversion (ADC) circuitry 104, and signal processing circuitry 106. In certain examples, automotive circuitry 100 may include additional or fewer components, not shown in or discussed with reference to FIG. 1, without varying from the scope of this disclosure.

Radar reception circuitry 102 may receive target reflections signals, which may indicate locations of surrounding objects, such as other vehicles on a roadway. Upon reception of the target reflection, radar reception circuitry 102 may provide the received target reflection signal to ADC circuitry 104 for data conversion.

ADC circuitry 104 may perform one or more operations to convert the signal from radar reception circuitry 102 into a digital signal for signal processing circuitry 106. For example, ADC circuitry 104 may receive the analog signal from radar reception circuitry 102, and one or more components within ADC circuitry 104 may determine a signal level of the analog signal. In an example, ADC circuitry 104 may determine the signal level of the analog signal by sampling the analog input signal at discrete points in time and comparing the sampled values with a set of reference values for quantization.

Based on the determined signal level of the analog signal, one or more components within ADC circuitry 104 may provide a dither signal with a varying RMS amplitude. ADC circuitry 104 may combine the dither signal with the analog signal from radar reception circuitry 104 and the combined signal may be provided to an ADC of ADC circuitry 104. The ADC may convert the combined analog signal to a digital signal, and may output the digital signal. A digital representation of the varied dither signal may be removed from the digital signal and the resulting signal may be a digital representation of the analog input signal. The resulting digital signal may be provided from ADC circuitry 104 to signal processing circuitry 106. Thus, ADC circuitry 104 utilizes a dither signal with a RMS amplitude that varies based on the amplitude level of the sampled analog input signal to improve the linearity of the ADC while not excessively reducing a dynamic range of the ADC.

Figure 2:
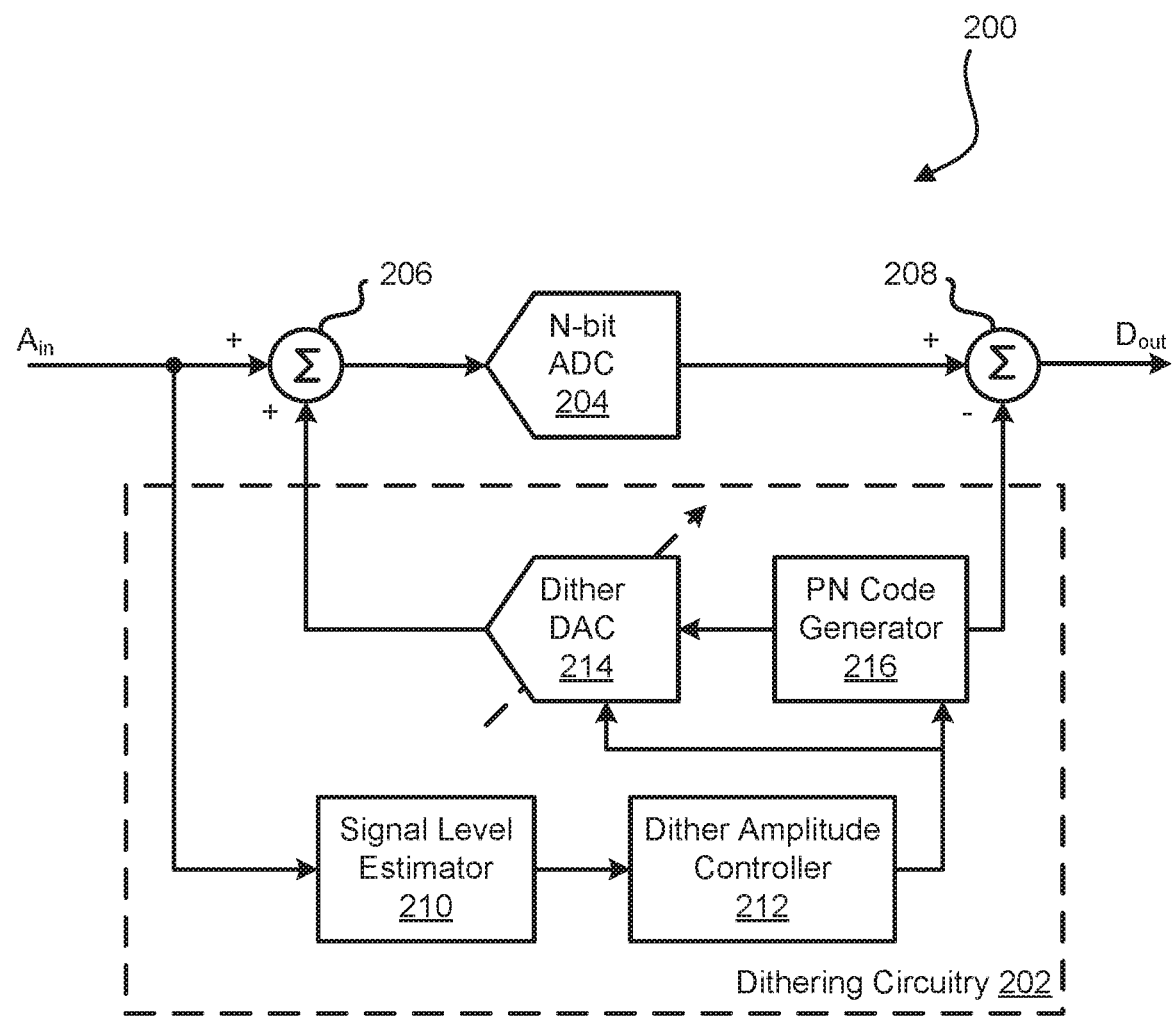
FIG. 2 is a block diagram illustrating a portion of analog-to-digital circuitry in accordance with at least one embodiment.

FIG. 2 illustrates ADC circuitry 200 including dithering circuitry 202, an ADC 204, adder 206, and subtractor 208. Dithering circuitry 202 includes a signal level estimator 210, a dither amplitude controller 212, a dither DAC 214, and a pseudo-noise (PN) or random code generator 216. In certain examples, ADC 204 may be any suitable ADC, such as an N-bit ADC, a successive approximation register (SAR) ADC, a flash ADC, or a pipeline ADC. In an example, ADC circuitry 200 may be any suitable circuitry, such as ADC circuitry 104 of FIG. 1. In certain examples, ADC circuitry 200 may include additional, or fewer components, not shown in or discussed with reference to FIG. 2, without varying from the scope of this disclosure.

In an example, ADC circuitry 200 may receive an analog input signal, $A_{in}$, and provide the analog input signal to both adder 206 and signal level estimator 210. In certain examples, signal level estimator 210 may be any suitable type of detector including, but not limited to, a two level detector and a four level detector. In an example, signal level estimator 210 may perform one or more operations to determine an amplitude of the analog input signal. For example, signal level estimator 210 may sample the analog input signal and generate a coarse estimation of the amplitude of the sampled signal. In an example, the coarse estimation may be generated via any suitable technique including, but not limited to, comparison of the analog signal to a threshold. In an embodiment, based on the analog signal being symmetric around zero, comparison of the analog signal to a threshold, as used herein, refers to comparing the analog signal to at least two threshold value (e.g., a positive value of the threshold and a negative value of the threshold). For example, a comparator may provide a first output signal based on the amplitude of the analog signal satisfying the threshold and a second output signal based on the amplitude of the analog signal not satisfying the threshold. Based on the amplitude of the sampled signal, signal level estimator 210 may create a signal that includes amplitude level information of the analog input signal, and provide the signal to dither amplitude controller 212.

Dither amplitude controller 212 may perform one or more operations to generate a control signal based on the amplitude of the sampled signal. For example, dither amplitude controller 212 may process the amplitude level information, and generate the control signal based on the amplitude level information. In an example, the control signal may vary in any suitable manner based on the amplitude of the analog input signal. For example, a first control signal may be created in response to the analog input signal having an amplitude that satisfies a threshold, and a second control signal may be created in response to the analog input signal having an amplitude that does not satisfy the threshold. In an example, the threshold may be any determined amplitude, such that signals with amplitudes greater than or equal to the threshold may be considered large amplitude signals and signals with amplitudes smaller than the threshold may be considered small amplitude signals. Dither amplitude controller 212 may provide the control signal to dither DAC 214.

PN code generator 216 may generate a pseudo-noise (PN) signal that is utilized within ADC circuitry 200 to improve the linearity of the ADC 204. In an example, the output of PN code generator is uncorrelated to analog input signal so that any mismatch induced conversion errors of ADC 204 may be randomized. This randomization of the conversion errors of ADC 204 may also result in a suppression of harmonic spurs in the output of ADC 204 in response to the PN signal being subtracted from the output of ADC 204.

Dither DAC 214 may receive the control signal from dither amplitude controller 212 and the PN signal from PN code generator 216. Based on the PN signal and the control signal, dither DAC 214 may perform one or more operations to generate a dither signal. In an example, dither DAC 214 may convert the PN signal to an analog dither signal. In certain examples, dither DAC 214 may vary the dither signal based on the control signal received from dither amplitude controller 212. As used herein, varying the dither signal refers to varying the RMS amplitude or peak amplitude of the dither signal. If dither DAC 214 receives a control signal, such as the first control signal described above, generated based on an analog input signal $A_{in}$ having an amplitude level that satisfies the threshold, dither DAC 214 may provide a dither signal with a small RMS amplitude or not provide the dither signal. However, if dither DAC 214 receives a control signal, such as the second control signal described above, generated based on an analog input signal having an amplitude level that does not satisfy the threshold, dither DAC 214 may provide a dither signal with a large RMS amplitude.

Dither DAC 214 may provide the dither signal to adder 206 to be added to the analog input signal. Adder 206 may provide the combined analog signal to ADC 204 for conversion to a digital signal. In an example, ADC 204 may have a limit to a range of signal levels that ADC 204 is capable of processing, such that any signal with an amplitude level above the range of ADC 204 is clipped to fit within the range of ADC 204. However, clipping input signals may result in loss of information due to large excessive noise and distortion.

Based on the combined signal from adder 206 being a combination of the analog input signal and the dither signal from dither DAC 214, dither DAC 214 may vary the level of the dither signal based on the amplitude of the analog input signal to keep the combined signal within the range of ADC 204. Therefore, as stated above, dither DAC 214 may provide a larger dither signal for smaller input signal levels and a smaller or no dither signal for larger input signal levels. In an example, a small input signal may be any determined level including, but not limited to, a signal level that is less than −5 dB of the full scale range of ADC 204. In this example, the large dithering signal may be any suitable value including, but not limited to, with maximum amplitude not greater than 17% of the full scale range of ADC 204. Additionally or alternatively, an input signal with a large amplitude may be a signal with any suitable level including, but not limited to, a level that is greater than −5 dB of the full scale range of ADC 204, and no dither signal may be provided. Thus, the effective input signal range of ADC 204 is not reduced while allowing large dither signals to be applied to small input signal levels to decrease spur harmonics.

ADC 204 may provide the converted sampled signal to subtractor 208, and PN code generator 216 may provide the PN signal to subtractor 208. In an example, 208 may remove the PN signal from the converted signal output by ADC 204, such that a digital representation of the analog input signal is provided as a digital output signal, $D_{out}$, from ADC circuitry 200. In an embodiment, dither DAC 214 providing a dither signal with a controlled amplitude enables a better tradeoff between ADC linearity and effective input range as compared to previous ADC circuitry.

In an additional or alternative embodiment, the PN signal provided to subtractor 208 may be controlled in any suitable manner so that the PN signal does not negatively impact the output signal from ADC 204. For example, dither amplitude controller 212 may provide the control signal to PN code generator 216, which in turn may utilize the control signal to vary the PN signal. If PN code generator 216 receives a control signal, such as the first control signal described above, generated based on an analog input signal $A_{in}$ having an amplitude level that satisfies the threshold, PN code generator 216 may provide a PN signal of all zeros. In this embodiment, subtraction of an PN signal of all zeros at subtractor 208 will not alter the output signal of ADC 204 when no dither signal is provided from dither DAC 214.

Figure 3:
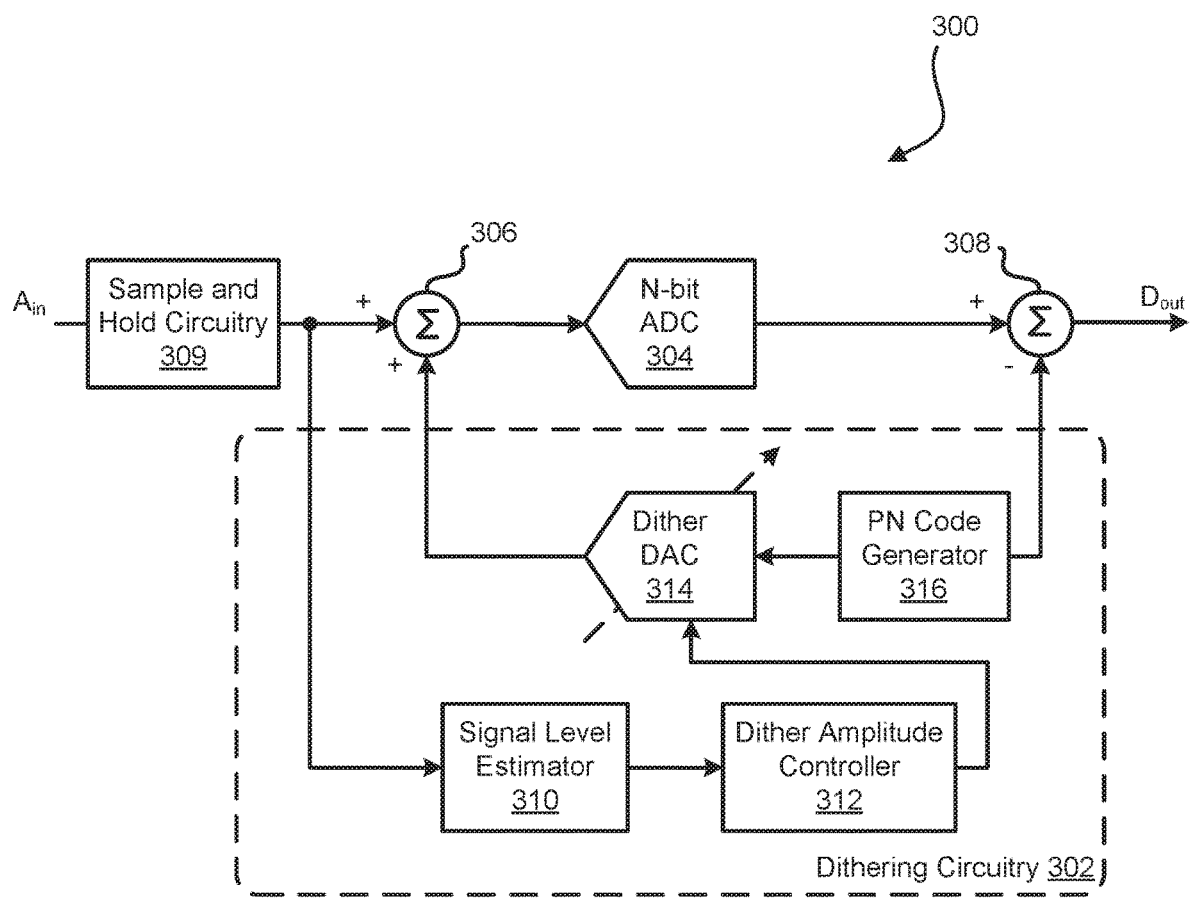
FIG. 3 is a block diagram illustrating a portion of another analog-to-digital conversion circuitry in accordance with at least one embodiment.

FIG. 3 illustrates a portion of another ADC circuitry 300 including dithering circuitry 302, an ADC 304, adder 306 and subtractor 308, and a sample and hold circuitry 309. Dithering circuitry 302 includes a signal level estimator 310, a dither amplitude controller 312, a dither DAC 314, and a PN code generator 316. In an example, ADC circuitry 300 may be any suitable circuitry, such as ADC circuitry 104 of FIG. 1 or ADC circuitry 200 of FIG. 2. In certain examples, ADC circuitry 300 may include additional or fewer components, not shown in or discussed with reference to FIG. 3, without varying from the scope of this disclosure.

In certain examples, dithering circuitry 302, ADC 304, adder/subtractor 306 and 308, signal level estimator 310, dither amplitude controller 312, dither DAC 314, and PN code generator 316 may operate in a substantially similar manner as dithering circuitry 202, ADC 204, mixers 206 and 208, signal level estimator 210, dither amplitude controller 212, dither DAC 214, and PN code generator 216 of FIG. 2 to generate an output digital signal, $D_{out}$, from an analog input signal, $A_{in}$. In an example, sample and hold circuitry 309 may enable signal level estimator 310 to sample the analog input single at the same time as a sample and hold circuit of ADC 304. In an example, sample and hold circuitry 309 may relax a timing requirement or speed requirement of a dither loop credited by signal level estimator 310, dither amplitude controller 312, dither DAC 314 and adder 306. In certain examples, sample and hold circuitry 309 may hold the sampled analog input voltage constant during a conversion time of ADC 304. For example, signal level estimator 310 may need to detect the sampled signal level and then dither DAC 314 may need to add a dither signal with certain amplitude level to this sampled signal. In this example, processing by signal level estimator 310, dither amplitude controller 312 and dither DAC 314 may add a time delay between the detection and the dither DAC output a signal to the analog adder 306. During this process, it is preferred that the input signal to adder 306 stay unchanged so that the correct analog signal is being added to a correct dither signal, and this can be achieved by sample and hold circuitry 309 holding the sampled analog input voltage constant during a conversion time of ADC 304.

Figure 4:
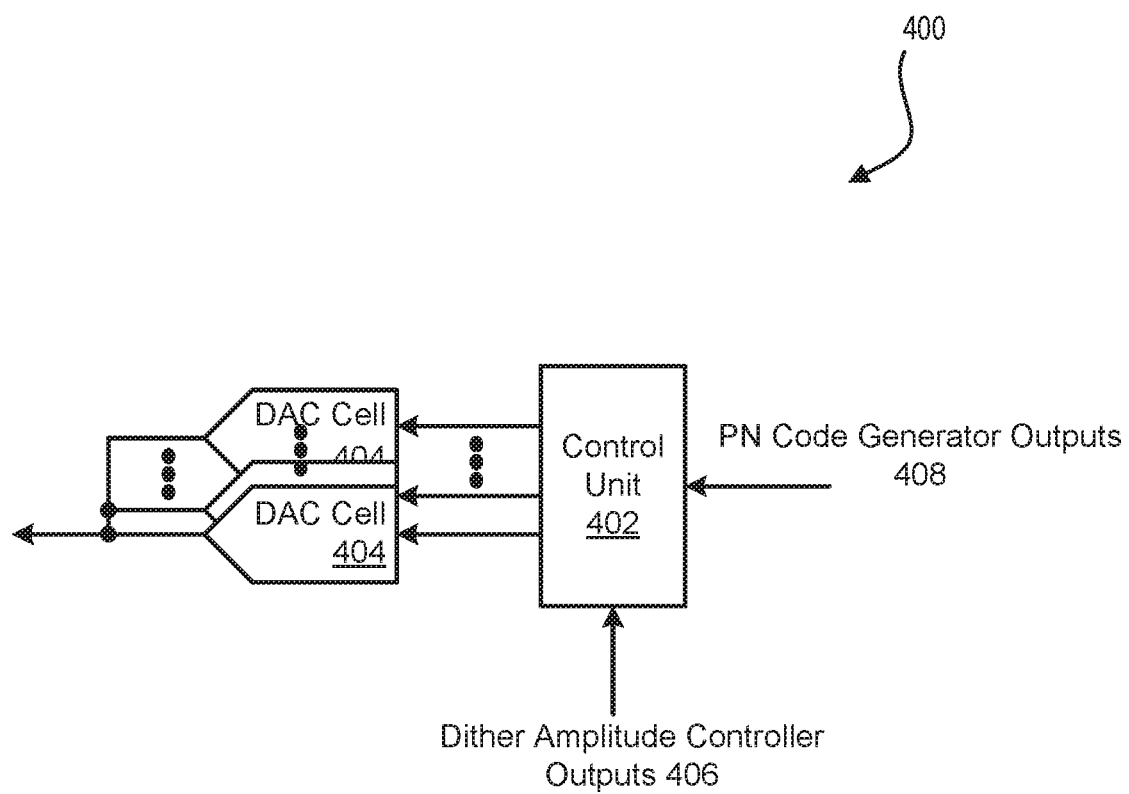
FIG. 4 is a block diagram illustrating a portion of a dithering digital-to-analog converter in accordance with at least one embodiment.

FIG. 4 illustrates a portion of dither DAC 400 in accordance with at least one embodiment. Dither DAC 400 includes a control unit 402 and multiple DAC cells 404. Dither DAC 400 may be any suitable circuitry, such as dither DAC 214 of FIG. 2 or dither DAC 314 of FIG. 3. In certain examples, dither DAC 400 may include additional or fewer components not shown in or discussed with reference to FIG. 4, without varying from the scope of this disclosure.

In an example, DAC cells 404 may be switchable current or switched capacitors/resistors cells, such that the output signal strength of the dither DAC 400 is adaptable by adjusting the reference current/voltage of the dither DAC 400 or the switch control signals. In another example, dither DAC 400 may be implemented by a multiple of DAC cells 404 (e.g., most significant bit (MSB), MSB-1 . . . , least significant bit (LSB)), with their outputs connected together.

During operations of dither DAC 400, control unit 402 may receive outputs 406 from a dither amplitude controller, such as dither amplitude controller 212 of FIG. 2 or dither amplitude controller 312 of FIG. 3, and outputs 408 from a PN code generator, such as PN code generator 216 of FIG. 2 or PN code generator 316 of FIG. 3.

In an example, if a large amplitude level signal is detected, the first portion of DAC cells 404 may be inactive and dither DAC 400 may generate and provide a dither signal based only outputs from the second portion of DAC cells 404. In this example, in response to a large input signal, the output of dither DAC 400 may be reduced as compared to other dither signals output from dither DAC 400. However, if a small sample signal amplitude is detected all dither DAC cells 404 are active, and dither DAC 400 may provide a dither signal with a larger amplitude based on the combined outputs of all of the DAC cells 404. Thus, dither DAC 400 may utilize the control signal from a dither amplitude controller to vary the dither signal so that linearity of an ADC may be improved while not reducing an effective inputrange of the ADC.

Figure 5:
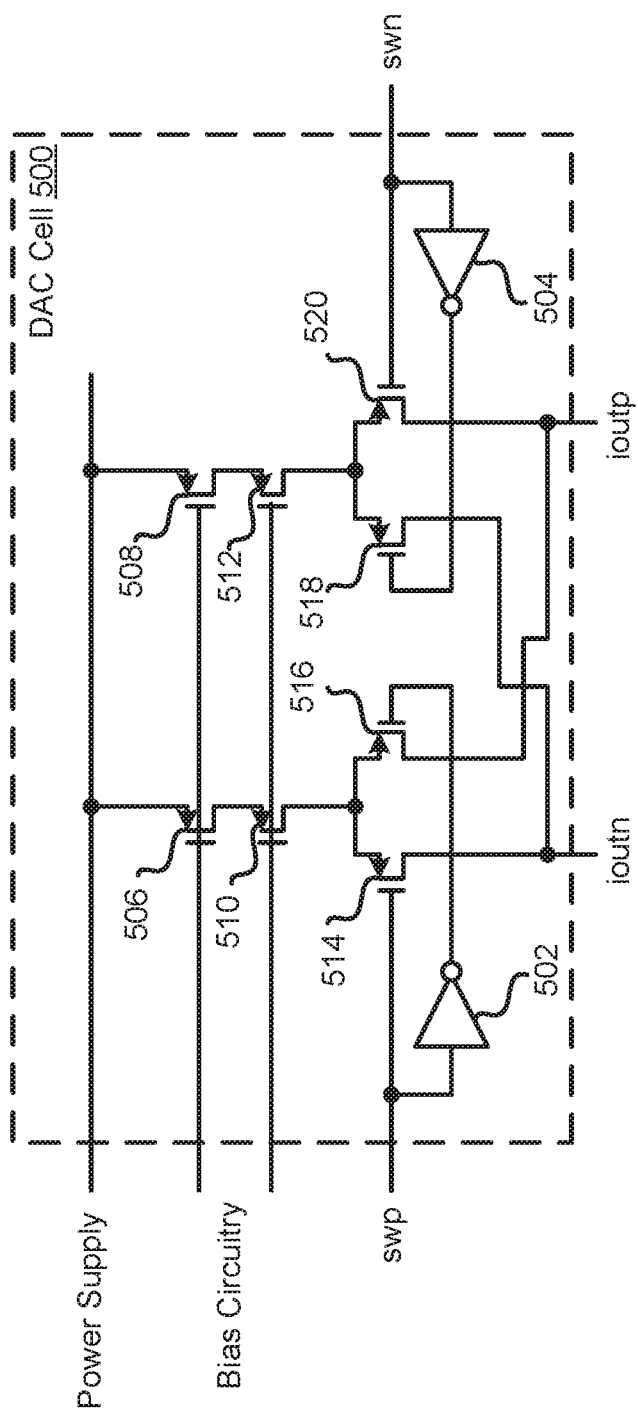
FIG. 5 is a schematic diagram illustrating a digital-to-analog converter cell in accordance with at least one embodiment.

FIG. 5 illustrates a DAC cell 500 in accordance with at least one embodiment. DAC cell 500 includes inverters 502 and 504, and transistors 506, 508, 510, 512, 514, 516, 518, and 520. DAC cell 500 may be any suitable circuitry, such as a MSB DAC cell 214 of DAC cells 404 in FIG. 4. In certain examples, DAC cell 500 may include additional or fewer components, not shown in or discussed with reference to FIG. 5, without varying from the scope of this disclosure.

Inverter 502 includes an input terminal coupled to a first control line, swp, and an output terminal. Inverter 504 includes an input terminal coupled to a second control line, swn, and an output terminal. Transistor 506 includes a first current electrode coupled to a power supply line, a second current electrode coupled to transistor 510, and a control gate coupled to a bias circuitry. Similarly, transistor 508 includes a first current electrode coupled to the power supply line, a second current electrode coupled to transistor 512, and a control gate coupled to the bias circuitry. Transistor 510 includes a first current electrode coupled to the second current electrode of transistor 506, a second current electrode coupled to transistors 514, 516, and a control gate coupled to a bias circuitry. Similarly, transistor 512 includes a first current electrode coupled to the second current electrode of transistor 508, a second current electrode coupled to transistors 518, 520, and a control gate coupled to the voltage cascade line. In an example, transistors 506 and 508 together with transistor 510 and 512 operate to form a current generator. For example, transistors 506, 508, 510, and 512 generate certain stable currents from power supply to transistors 514, 516, 518, and 520 based on control signals from the bias circuitry. In certain examples, transistors 514, 516, 518, and 520 operate as switches to either provide the current from transistors 506, 508, 510, and 512 to output terminals ioutn and ioutp or not.

Transistor 514 includes a first current electrode coupled to the second current electrode of transistor 510, a second current electrode connected to output terminal ioutn, and a control gate coupled to the first control line, swp. Transistor 516 includes a first current electrode coupled to the second current electrode of transistor 510, a second current electrode connected to output terminal ioutp, and a control gate coupled to the output terminal of inverter 502. Transistor 518 includes a first current electrode coupled to the second current electrode of transistor 512, a second current electrode coupled to the second current electrode of transistor 514, and a control gate coupled to the output terminal of inverter 504. Transistor 520 includes a first current electrode coupled to the second current electrode of transistor 512, a second current electrode coupled to the second current electrode of transistor 516, and a control gate coupled to the second control line, swn.

In an example, outputs ioutn and ioutp of DAC cell 500 may be determined based on truth table 1 provided below.

TABLE 1

Tri-state switch control truth table

| swp | swn | ioutn | ioutp |
|-----|-----|-------|-------|
| 0 | 0 | iu | iu |
| 0 | 1 | 2*iu | 0 |
| 1 | 0 | 0 | 2*iu |
| 1 | 1 | iu | iu |

The values of truth table 1 will be described with respect to FIG. 5. In an example, if the analog input signal includes a large sample signal amplitude, a signal level detector, such as signal level detector 210 or 310, may output a particular value, such as 0, which in turn may force control signals swp and swn to be have the same value, such as 00 or 11. In this example, only one of the two transistors coupled to an output terminal, such as ioutn or ioutp, is active. Thus, the outputs ioutn and ioutp may be equal, which in turn may cause the differential output between ioutp and ioutn to be zero. For example, if the control signals swp and swn are 11, transistors 514 and 520 are both on and transistors 516 and 518 are both off. Thus, the current provided at ioutn is only the current through transistor 514, and the current provided at ioutp is only the current through transistor 520. Similarly, if the control signals swp and swn are 00, transistors 516 and 518 are both on and transistors 514 and 520 are both off. Thus, the current provided at ioutn is only the current through transistor 518, and the current provided at ioutp is only the current through transistor 516. In an example, the equal currents provided at ioutn and ioutp may cause a combined output current of DAC cell 500 to be zero, such that DAC cell 500 is inactive.

In an example, if the analog input signal has a small amplitude, a signal levels detector, such as signal level detector 210 or 310, may output a particular value, such as 1, which in turn may force control signals swp and swn to have different values, such as 01 or 10. In this example, one of the outputs, ioutn or ioutp, provides current to the load while the other output does not have a current causing the differential output between ioutp and ioutn to be double the current through a single transistor of DAC cell 500. For example, if the control signals swp and swn are 01, transistors 516 and 520 are both on and transistors 514 and 518 are both off. Thus, the current provided at ioutp is the current through transistors 516 and 520, and no current is provided at ioutn. However, if the control signals swp and swn are 10, transistors 514 and 518 are both on and transistors 516 and 520 are both off. Thus, the current provided at ioutn is the current through transistors 514 and 518, and no current provided at ioutp. In an example, the differential currents provided at ioutn and ioutp cause DAC cell 500 to be active, which may increase the output level of dither signal from a dither DAC including DAC cell 500. Thus, a dither DAC including multiple DAC cells 500 may utilize the control signal from a dither amplitude controller to vary the dither signal so that linearity of an ADC may be improved while not reducing a dynamic range of the ADC.

Figure 6:
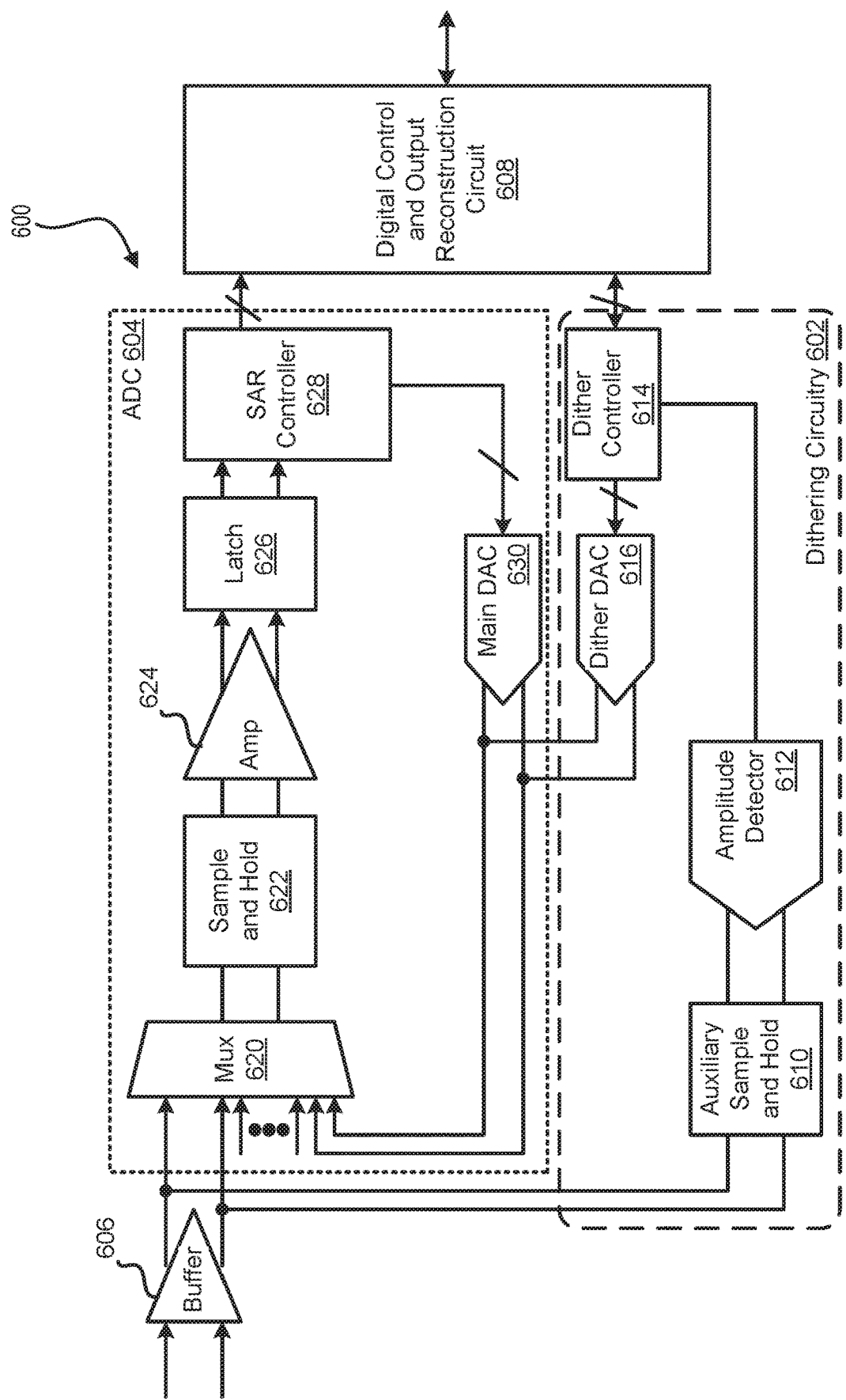
FIG. 6 is a block diagram illustrating a portion of another analog-to-digital conversion circuitry in accordance with at least one embodiment.

FIG. 6 illustrates a portion of ADC circuitry 600 in accordance with at least one embodiment. ADC circuitry 600 includes dithering circuitry 602, an ADC 604, a buffer 606, and a digital control and output reconstruction circuit 608. The dithering circuitry 602 includes an auxiliary sample and hold circuit 610, an amplitude detector 612, a dither controller 614, and a dither DAC 616. ADC 604 includes a multiplexor 620, a sample and hold circuit 622, an amplifier 624, a latch 626, a SAR controller 628, and a main DAC 630. In an example, ADC circuitry 600 may be any suitable circuitry, such as ADC circuitry 104 of FIG. 1. In certain examples, ADC circuitry 600 may include additional, or fewer components, not shown in or discussed with reference to FIG. 6, without varying from the scope of this disclosure.

In an example, ADC circuitry 600 may receive an analog input signal and provide the analog input signal to buffer 606, which in turn may provide the analog input signal to multiplexor 620. In an example, analog input signal may be any suitable type of signal including, but not limited to, differential signal. In certain examples, multiplexor 620, sample and hold circuit 622, amplifier 624, latch 626, SAR controller 628, main DAC 630, and digital control and output reconstruction circuit 608 may perform one or more operations to convert the analog input signal to a digital signal. For example, multiplexor 620, sample and hold circuit 622, amplifier 624, latch 626, SAR controller 628, main DAC 630, and digital control and output reconstruction circuit 608 may combine to convert the analog input signal into a discrete digital representation based on similar techniques of SAR ADCs including, but not limited to, performing a binary search of all possible quantization levels of the analog signal before determining a digital output for the conversion. However, the output of ADC 604 may based on a dithering signal provided from dithering circuitry 602 based on the amplitude of the analog input signal.

In certain examples, buffer 606 may provide the analog input signal to auxiliary sample and hold signal 610. In an example, auxiliary sample and hold signal 610 may perform one or more operations to sample the analog input signal and provide the sampled signal to amplitude detector 612. In certain examples, amplitude detector 612 may determine an amplitude of the sampled signal. For example, amplitude detector 612 may generate a coarse estimation of the amplitude of the sampled signal. In an example, the coarse estimation may be generated via any suitable technique including, but not limited to, comparison of the analog signal to a threshold. For example, a comparator may provide a first output signal based on the amplitude of the analog signal satisfying the threshold and a second output signal based on the amplitude of the analog signal not satisfying the threshold. Based on the amplitude of the sampled signal, amplitude detector 612 may create a signal that includes amplitude level information of the analog input signal, and provide the signal to dither controller 614.

Dither controller 614 may perform one or more operations to generate a control signal based on the amplitude of the sampled signal. For example, dither controller 614 may process the amplitude level information, and generate the control signal based on the amplitude level information. In an example, the control signal may vary in any suitable manner based on the amplitude of the analog input signal. For example, a first control signal may be created in response to the analog input signal having an amplitude that satisfies a threshold, and a second control signal may be created in response to the analog input signal having an amplitude that does not satisfy the threshold. In an example, the threshold may be any determined amplitude, such that signals with amplitudes greater than or equal to the threshold may be considered large amplitude signals and signals with amplitudes smaller than the threshold may be considered small amplitude signals. Dither controller 614 may provide the control signal to dither DAC 616.

Dither DAC 616 may receive the control signal from dither controller 614. Based on the control signal, dither DAC 616 may perform one or more operations to generate a dither signal. In an example, dither DAC 616 may vary the dither signal based on the control signal received from dither controller 614. For example, if dither DAC 616 receives a control signal, such as the first control signal described above, generated based on an analog input signal having an amplitude level that satisfies the threshold, dither DAC 616 may provide a dither signal with a small amplitude or not provide the dither signal. However, if dither DAC 616 receives a control signal, such as the second control signal described above, generated based on an analog input signal having an amplitude level that does not satisfy the threshold, dither DAC 616 may provide a dither signal with a large amplitude.

In an example, dither controller 614 may provide a PN signal along with the control signal to dither DAC 616. In certain examples, dither controller 614 may generate the PN signal in any suitable manner, such as in a manner substantially similar to PN code generator 216 of FIG. 2. In an example, the PN noise is uncorrelated to analog input signal so that any mismatch induced conversion errors of ADC 604 may be randomized. This randomization of the conversion errors of ADC 604 may also result in a suppression of harmonic spurs in the output of ADC 604 in response to the PN signal being subtracted from the output of ADC 604 by digital control and output reconstruction circuit 608.

Dither DAC 616 may provide the dither signal to the output of main DAC 630 to be combined with output of main DAC 630. The combined signal may be provided to multiplexor 620, which in turn may utilize the combined signal in any suitable manner to combine the DAC output signal with the sampled analog input signal. In an example, ADC 604 may have a limit range of signal levels that ADC 604 is capable of processing, such that any signal with an amplitude level above the range of ADC 604 is clipped to fit within the range of ADC 604. However, clipping input signals may result in data distortion.

Based on the signal from multiplexor 620 being a combination of the dither signal from dither DAC 616 and main DAC 630, dither DAC 616 may vary the level of the dither signal based on the amplitude of the analog input signal to keep the combined signal within the range of ADC 604. Therefore, as stated above, dither DAC 616 may provide a larger dither signal for smaller input signal levels and a smaller or no dither signal for large input signal levels. Thus, the effective input signal range of ADC 604 is not reduced while allowing large dither signals to be applied to small input signal levels to decrease spur harmonics.

In an example, ADC circuitry 600 may perform a repetitive operation, such as sample the input signal and then perform an analog-to-digital conversion of the input signal to find a digital representation of the sample signal. For example, the input analog signal may be sampled simultaneously by both sample and hold circuit 622 and auxiliary sample and hold circuitry 610. Next, amplitude detector 612 may determine a level of the sampled input signal and provide a control signal to dither DAC 616, which in turn may generate a dither signal with certain amplitude. Upon the dither signal being generated, ADC 604 may start the conversion phase to convert the combined sampled signal and the dither DAC signal into digital codes. In an embodiment, during the conversion of the analog signal by ADC 604, the output value of dither DAC 616 is kept unchanged.

In an additional or alternative example, SAR controller 628 may utilize a first two decisions (MSB and MSB-1 bits) of a comparator within ADC 604 to determine the sample signal level information. Based on the sample signal level information from these two decisions, SAR controller 628 may determine whether to apply a dither signal, such that a dedicated detection path may be skipped and hardware may be saved within the ADC circuitry 600. In an example, code patterns from the comparator during each SAR conversion may provide an indication of the sample signal level. In response to the digital codes having predetermined patterns, such as [1,0] or [0,1], a determination is made that ADC 604 is converting an input signal with a low amplitude, such that a control signal is provided from dither controller 614, a dither signal is provided by dither DAC 616, a dither signal is provided from main DAC 630. However, in response to the digital codes not having the predetermined patterns, a determination is made that ADC 604 is converting an input signal with a large amplitude, such that a dither signal is not provided from dither DAC 616. In this embodiment, auxiliary sample and hold circuitry 610 and amplitude detector 612 may be eliminated.

In an additional or alternative example, strength of reflected signals in a radar system, such as radar system 100 of FIG. 1, may be determined at the beginning a chirp sequence of the signal. In an example, a chirp sequence may contain over hundreds of frequency ramps or chirps for which each last for a short period of tenths of microseconds (us). During one chirp sequence the signal strength (received signal power or RMS amplitude) may remain almost constant from chirp to chirp because objects in an automotive application are consider stationary within the measurement periods of few milliseconds with only the phases the signals among chirps varying. In an example, the first chirp of the sequence may be utilized to estimate the down converted and filtered target reflection signal level. In this example, ADC 604 may detect an input signal strength during the conversion of the signal in the first chirp, such that signal level estimator 210 and amplitude detector 612 may not be needed. In an example, the strength of the dither signal generated by dither DAC 616 may be set using the input signal level information obtained by ADC 604.

Additionally or alternatively, a multi-bit DAC, such as DAC 214 of FIG. 2, DAC 314 of FIG. 3, DAC 400 of FIG. 4, or DAC 630 of FIG. 6, may convert an N-bit digital signal, Din, to an analog current, Iout. This can be accomplished by the DAC having multiple input bits that each controls a current that may be binarily weighted with respect to a unit value, Iu. In an example, a first switch within the DAC may by a least significant bit (LSB) and an Nth switch may be the most significant bit (MSB). In this example, current sources are scaled up by a factor of two from one bit to the next. In an embodiment, the largest DAC cell is the MSB cell and the smallest DAC cell is the LSB cell.

Additionally or alternatively, dithering circuitry, such as dithering circuitry 202 of FIG. 2, dithering circuitry 302 of FIG. 3, or dithering circuitry 602 of FIG. 6, may utilize two or more signal level thresholds to determine a level of a dither signal to provide to an ADC. For example, dithering circuitry may compare the amplitude of an analog input signal to both a first threshold and a second threshold. In this example, if the amplitude of the analog input signal does not satisfy the first threshold or the second threshold, the dithering circuitry may determine that the analog input signal is a low level signal and as a result may provide a large dither signal to be combined with the analog input signal prior to the signal being provided to the ADC. If the amplitude of the analog input signal satisfies the first threshold but does not satisfy the second threshold, the dithering circuitry may determine that the analog input signal is a medium level signal and as a result may provide a medium dither signal to be combined with the analog input signal prior to the signal being provided to the ADC. If the amplitude of the analog input signal satisfies both the first threshold and the second threshold, the dithering circuitry may determine that the analog input signal is a high level signal and as a result may provide a small dither signal or no dither signal to be combined with the analog input signal prior to the signal being provided to the ADC. Thus, in this example, the multiple level dither signal states may improve the linearity of the ADC with more granularity than a single threshold, and may continue to not exceed the dynamic range of the ADC based on varying the dither signal according to the level of the analog input signal.

The embodiments described above utilize reference path dithering where the reference signals are voltage signals. However, it will be further understood that the teachings of the present disclosure are not necessarily limited to dithering on voltage signals only, but may be similarly applied where an ADC circuit utilizes currents as references.

Figure 7:
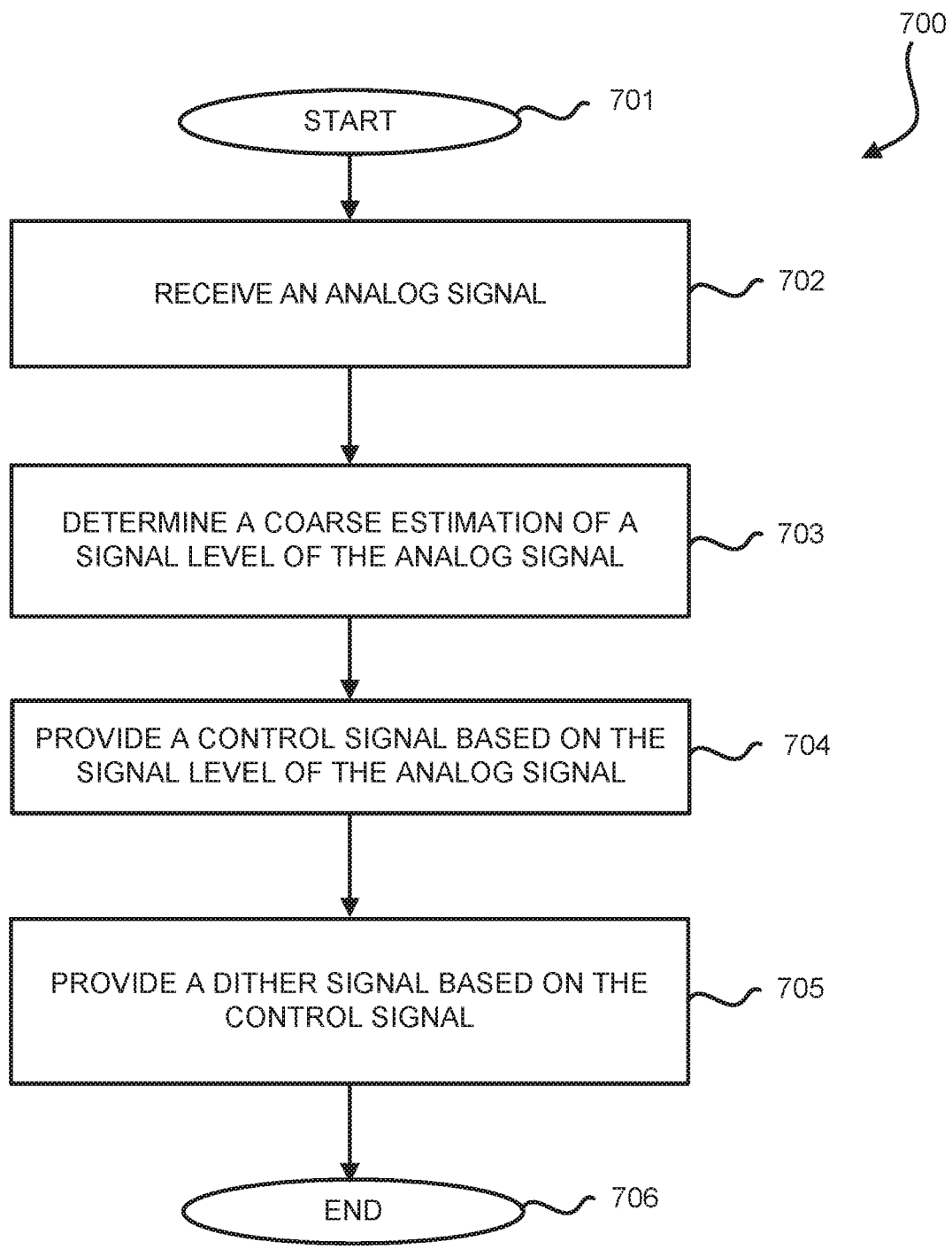
FIG. 7 is a flow diagram illustrating a method for dithering control based on a signal amplitude for a data conversion circuit according to at least one embodiment of the disclosure.

FIG. 7 is a flow diagram illustrating a method 700 for dithering control based on a signal amplitude for a data conversion circuit according to at least one embodiment of the disclosure. It will be readily appreciated that not every method step set forth in this flow diagram is always necessary, and that certain steps of the methods can be combined, performed simultaneously, in a different order, or perhaps omitted, without varying from the scope of the disclosure. In an embodiment, method 700 of FIG. 7 may be executed to increase an input range of an analog-to-digital (ADC) by combining an analog input signal with an amplitude varying dither signal prior to the analog input signal being provided to the ADC.

Method 700 begins at block 701 and continues to block 702. At block 702, an analog signal is received. Block 702 may be performed in a manner described above. For example, the analog signal may be received by dithering circuitry. In an example, the analog signal may any suitable signal including, but not limited to, a chirp sequence of target reflection signals in an automotive radar system.

At block 703, a coarse estimation of a signal level of the analog signal is determined. Block 703 may be performed in a manner described above. In certain examples, the signal level may be determined during a sampling phase of an ADC or after the sampling phase. In some examples, the signal level may be determined by dedicated amplitude detection circuits or based on the first two decisions of a comparator.

At block 704, a control signal is provided based on the signal level of the analog signal. Block 704 may be performed in a manner described above. In an example, the control signal may vary based on the signal level of the analog signal.

At block 705, a dither signal based on the control signal is provide. Block 705 may be performed in a manner described above. In an example, the control signal may cause the dither signal to vary based on the signal level of the analog signal. For example, the control signal may cause the dither signal vary in any suitable way including, but not limited to, increasing the dither signal based on a low signal level of the analog signal and decreasing the dither signal based on a high signal level of the analog signal. Method 700 ends at block 706.

In accordance with at least one embodiment, analog-to-digital converter (ADC) circuitry includes dithering circuitry to receive an analog signal and to provide a dither signal. In an embodiment, the dithering circuitry includes a signal level detector, a dither amplitude controller, and a dither digital-to-analog converter (DAC). In this embodiment, the signal level detector has an input to receive the analog signal and an output to provide amplitude level information associated with the analog signal. In an embodiment, the signal level detector may determine a coarse estimation of analog signal level and provide the coarse estimation the analog signal level within the amplitude level information. In an embodiment, the dither amplitude controller has an input to receive the amplitude level information from the signal level detector, and an output to provide a control signal. In this embodiment, the dither amplitude controller may vary the control signal based on the amplitude level information. In an embodiment, the dither DAC has an input to receive the control signal from the dither amplitude controller, and an output to provide the dither signal based on the control signal, wherein the dither signal varies based on an amplitude level of the analog signal.

In an embodiment, the dither DAC can be a multi-bit DAC with a plurality of output levels, includes: a plurality DAC cells (e.g. MSB, MSB-1, MSB-2 . . . , LSB), each of the DAC cells having different sizes (or voltage/current values), and each of the DAC cells having an input to receive a control signal, and each of the DAC cells to provide an output based on the control signal. In this embodiment, the dither DAC combines the outputs of the DAC cells to create the dither signal.

In an embodiment, in response to the amplitude level of the analog signal satisfying a threshold, the MSB DAC cells are inactivate and the dither signal is created only from the outputs of the LSB DAC cells.

In another embodiment, in response to the amplitude level of the analog signal not satisfying the threshold, all of the MSB DAC cells and the LSB DAC cells are activate and the dither signal is created from the outputs of the MSB DAC cells and the LSB DAC cells.

In an embodiment, the signal level detector includes a sample and hold circuit to sample the analog signal at a same time as a sample and hold circuit of an N-bit ADC circuit within the ADC. In an embodiment, the ADC circuitry further includes a comparator to perform multiple determinations of whether the analog signal level satisfies a threshold level. In an embodiment, a determination of whether to apply the dither signal is based on a first determination and based on a second determination of the comparator.

In an embodiment, the ADC detects an amplitude level of a signal during the conversion of the signal of a first chirp of a chip sequence within a radar system, and the dither DAC sets a strength of the dither signal based on the detected amplitude level.

In accordance with at least one embodiment, a method include receiving, at a signal level detector of dithering circuit of an analog-to-digital converter (ADC), an analog signal. The method also includes determining, by the signal level detector, a coarse estimation of analog signal level. The method further includes providing, by the signal level detector, amplitude level information associated with the analog signal based on the coarse estimation of the analog signal level. The method also includes providing, by a dither amplitude controller, a control signal. The control signal is varied based on the amplitude level information. The method further includes providing, by a dither digital-to-analog converter (DAC), a dither signal based on the control signal. The dither signal varies based on an amplitude level of the analog signal.

In an embodiment, the method also includes providing, by a plurality of most significant bit (MSB) DAC cells, an output based on the control signal. The method further includes providing, by a plurality of least significant bit (LSB) DAC cells, an output based on the control signal. The method also includes combining the outputs from each of the MSB DAC cells and the LSB DAC cells to create the dither signal.

In an embodiment, the method includes in response to the amplitude level of the analog signal satisfying a threshold: inactivating the MSB DAC cells; and creating the dither signal only from the outputs of the LSB DAC cells.

In an embodiment, the method includes in response to the amplitude level of the analog signal not satisfying the threshold: activating all of the MSB DAC cells and the LSB DAC cells; and creating the dither signal from the outputs of the MSB DAC cells and the LSB DAC cells.

In an embodiment, the method includes sampling, by a sample and hold circuit in the signal level detector, the analog signal at a same time as a sample and hold circuit of an N-bit ADC circuit within the ADC.

In an embodiment, the method includes performing, by a comparator, a first determination whether the analog signal level satisfies a threshold level. The method also include performing, by the comparator, a second determination whether the analog signal level satisfies the threshold level. The method further includes determining whether apply the dither signal based on the first determination and based on the second determination.

In an embodiment, the method includes detecting, the signal level detector, an amplitude level of a signal based on a first chirp of a chip sequence within a radar system. The method also includes setting, by the dither DAC, a strength of the dither signal based on the detected amplitude level.

In accordance with at least one embodiment, analog-to-digital converter (ADC) circuitry includes an ADC, a signal level detector, a dither amplitude controller, and a dither digital-to-analog converter (DAC). In this embodiment, the ADC includes an input terminal to receive a combined signal. The combined signal includes an analog input signal and a dithering signal. In this embodiment, the signal level detector has an input to receive the analog signal and an output to provide amplitude level information associated with the analog signal. In an embodiment, the signal level detector may determine a coarse estimation of analog signal level and provide the coarse estimation the analog signal level within the amplitude level information. In an embodiment, the dither amplitude controller has an input to receive the amplitude level information from the signal level detector, and an output to provide a control signal. In this embodiment, the dither amplitude controller may vary the control signal based on the amplitude level information. In an embodiment, the dither DAC has an input to receive the control signal from the dither amplitude controller, and an output to provide the dither signal based on the control signal, wherein the dither signal varies based on an amplitude level of the analog signal.

In an embodiment, the dither DAC includes: a plurality of DAC cells with different sizes, each of the DAC cells having an input to receive a control signal, and each of the DAC cells to provide an output based on the control signal. In this embodiment, the dither DAC combines the outputs of the DAC cells to create the dither signal.

In an embodiment, in response to the amplitude level of the analog signal satisfying a threshold, the MSB DAC cells are inactivate and the dither signal is created only from the outputs of the smaller DAC cells.

In another embodiment, in response to the amplitude level of the analog signal not satisfying the threshold, all of the DAC cells are activate and the dither signal is created from the outputs of the DAC cells.

In an embodiment, the signal level detector includes a sample and hold circuit to sample the analog signal at a same time as a sample and hold circuit of an N-bit ADC circuit within the ADC. In an embodiment, a determination of whether to apply the dither signal is based on a first determination and based on a second determination of the comparator.

In an embodiment, the signal level detector detects an amplitude level of a signal based on a first chirp of a chip sequence within a radar system, and the dither DAC sets a strength of the dither signal based on the detected amplitude level for the rest of the chirps in one chirp sequence.

The concepts of the present disclosure have been described above with reference to specific embodiments. However, one of ordinary skill in the art will appreciate that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. Analog-to-digital converter (ADC) circuitry including dithering circuitry configured and arranged to receive an analog signal and to provide a dither signal, the dithering circuitry comprising:
   a signal level detector having an input to receive the analog signal and an output to provide amplitude level information associated with the analog signal, the signal level detector to determine a coarse estimation of analog signal level and to provide the coarse estimation of the analog signal level within the amplitude level information;
   a dither amplitude controller having an input to receive the amplitude level information from the signal level detector, and an output to provide a control signal, the dither amplitude controller to vary the control signal based on the amplitude level information;
   a random code generator to provide a pseudo-noise (PN) signal;
   a dither digital-to-analog converter (DAC) having an input to receive the control signal from the dither amplitude controller and the PN signal from the random code generator, and an output to provide the dither signal based on the control signal and the PN signal, wherein the dither signal varies based on an amplitude level of the analog signal; and
   a plurality of DAC cells with various sizes, each of the DAC cells having inputs to receive a control signal, each of the DAC cells to provide an output based on the control signal, the dither DAC to combine the outputs of the DAC cells to create the dither signal.

2. The ADC circuitry of claim 1 wherein, in response to the amplitude level of the analog signal satisfying one or more thresholds, most significant bit (MSB) DAC cells are inactivate and the dither signal is created only from the outputs of least significant bit (LSB) DAC cells.

3. The ADC circuitry of claim 2 wherein, in response to the amplitude level of the analog signal not satisfying a threshold of the one or more thresholds, all of the DAC cells including a first DAC cell, a second DAC cell, and a third DAC cell, and a fourth DAC cell are activate and the dither signal is created from the outputs of all the DAC cells.

4. The ADC circuitry of claim 1 wherein the signal level detector includes:
   a sample and hold circuit to sample the analog signal at a same time as a sample and hold circuit of an N-bit ADC circuit within the ADC.

5. The ADC circuitry of claim 1 further comprises:
   a comparator to perform single or multiple determinations of whether the analog signal level satisfies a threshold level, wherein a determination whether to apply the dither signal is based on a first determination only or on the first determination and a second determination of the comparator.

6. The ADC circuitry of claim 1, the ADC to detect an amplitude level of a signal during a conversion of a first chirp of a chip sequence within a radar system, and the dither DAC to set a strength of the dither signal based on the detected amplitude level.

7. A method comprising:
   receiving, at a signal level detector of a dithering circuit of an analog-to-digital converter (ADC), an analog signal;
   determining, by the signal level detector, a coarse estimation of analog signal level;
   providing, by the signal level detector, amplitude level information associated with the analog signal based on the coarse estimation of the analog signal level;
   providing, by a dither amplitude controller, a control signal, wherein the control signal is varied based on the amplitude level information;
   providing, by a dither digital-to-analog converter (DAC), a dither signal based on the control signal, wherein the dither signal varies based on an amplitude level of the analog signal;
   providing, by a plurality DAC cells, an output based on the control signal; and
   combining the outputs from each of the DAC cells to create the dither signal.

8. The method of claim 7 further comprising:
   in response to the amplitude level of the analog signal satisfying one or more thresholds:
     deactivating most significant bit (MSB) DAC cells; and
     creating the dither signal only from the outputs of the LSB DAC cells.

9. The method of claim 8 further comprising:
   in response to the amplitude level of the analog signal not satisfying the threshold:
     activating all of the DAC cells; and
     creating the dither signal from the outputs of the DAC cells.

10. The method of claim 7 further comprising:
    sampling, by a sample and hold circuit in the signal level detector, the analog signal at a same time as a sample and hold circuit of an N-bit ADC circuit within the ADC.

11. The method of claim 7 further comprising:
    performing, by a comparator, a first determination whether the analog signal level satisfies a threshold level;
    performing, by the comparator, a second determination whether the analog signal level satisfies the threshold level; and
    determining whether apply the dither signal based on the first determination and based on the second determination.

12. The method of claim 7 further comprising:
    detecting, by the ADC, an amplitude level of a signal during a conversion of a first chirp of a chip sequence within a radar system; and
    setting, by the dither DAC, a strength of the dither signal based on the detected amplitude level.

13. Analog-to-digital converter (ADC) circuitry comprising:
an analog-to-digital converter including an input terminal to receive a combined signal, wherein the combined signal includes an analog input signal and a dithering signal;
a signal level detector having an input to receive the analog input signal and an output to provide amplitude level information associated with the analog input signal, the signal level detector to determine a coarse estimation of analog input signal level and to provide the coarse estimation the analog input signal level within the amplitude level information, the signal level detector including a sample and hold circuit to sample the analog input signal at a same time as a sample and hold circuit of an N-bit ADC circuit within the ADC;
a dither amplitude controller having an input to receive the amplitude level information from the signal level detector, and an output to provide a control signal, the dither amplitude controller to vary the control signal based on the amplitude level information;
a random code generator to provide a (PN) signal; and
a dither digital-to-analog converter (DAC) having an input to receive the control signal from the dither amplitude controller and the PN signal from the random code generator, and an output to provide the dither signal based on the control signal and the PN signal, wherein the dither signal varies based on an amplitude level of the analog input signal.

14. The ADC circuitry of claim 13 wherein the dither DAC includes:
a plurality of DAC cells with various sizes, each of the DAC cells having an input to receive a control signal, each of the DAC cells to provide an output based on the control signal;
the dither DAC to combine the outputs of the DAC cells to create the dither signal.

15. The ADC circuitry of claim 14 wherein, in response to the amplitude level of the analog input signal satisfying one or more thresholds, the MSB DAC cells are inactive and the dither signal is created only from the outputs of the LSB DAC cells.

16. The ADC circuitry of claim 15 wherein, in response to the amplitude level of the analog input signal not satisfying a threshold of the one or more thresholds, all of the MSB DAC cells and the LSB DAC cells are activate and the dither signal is created from the outputs of the MSB DAC cells and the LSB DAC cells.

17. The ADC circuitry of claim 13 wherein the signal level detector to detect an amplitude level of a signal based on a first chirp of a chip sequence within a radar system, and the dither DAC to set a strength of the dither signal based on the detected amplitude level.

18. Analog-to-digital converter (ADC) circuitry including dithering circuitry configured and arranged to receive an analog signal and to provide a dither signal, the dithering circuitry comprising:
a signal level detector having an input to receive the analog signal and an output to provide amplitude level information associated with the analog signal, the signal level detector to determine a coarse estimation of analog signal level and to provide the coarse estimation of the analog signal level within the amplitude level information, the signal level detector including a sample and hold circuit to sample the analog signal at a same time as a sample and hold circuit of an N-bit ADC circuit within the ADC;
a dither amplitude controller having an input to receive the amplitude level information from the signal level detector, and an output to provide a control signal, the dither amplitude controller to vary the control signal based on the amplitude level information;
a random code generator to provide a pseudo-noise (PN) signal; and
a dither digital-to-analog converter (DAC) having an input to receive the control signal from the dither amplitude controller and the PN signal from the random code generator, and an output to provide the dither signal based on the control signal and the PN signal, wherein the dither signal varies based on an amplitude level of the analog signal.

19. A method comprising:
receiving, at a signal level detector of a dithering circuit of an analog-to-digital converter (ADC), an analog signal;
determining, by the signal level detector, a coarse estimation of analog signal level;
providing, by the signal level detector, amplitude level information associated with the analog signal based on the coarse estimation of the analog signal level;
providing, by a dither amplitude controller, a control signal, wherein the control signal is varied based on the amplitude level information;
providing, by a dither digital-to-analog converter (DAC), a dither signal based on the control signal, wherein the dither signal varies based on an amplitude level of the analog signal; and
sampling, by a sample and hold circuit in the signal level detector, the analog signal at a same time as a sample and hold circuit of an N-bit ADC circuit within the ADC.

20. Analog-to-digital converter (ADC) circuitry comprising:
an analog-to-digital converter including an input terminal to receive a combined signal, wherein the combined signal includes an analog input signal and a dithering signal;
a signal level detector having an input to receive the analog input signal and an output to provide amplitude level information associated with the analog input signal, the signal level detector to determine a coarse estimation of analog input signal level and to provide the coarse estimation the analog input signal level within the amplitude level information, the signal level detector to detect an amplitude level of a signal based on a first chirp of a chip sequence within a radar system;
a dither amplitude controller having an input to receive the amplitude level information from the signal level detector, and an output to provide a control signal, the dither amplitude controller to vary the control signal based on the amplitude level information;
a random code generator to provide a (PN) signal; and
a dither digital-to-analog converter (DAC) having an input to receive the control signal from the dither amplitude controller and the PN signal from the random code generator, and an output to provide the dither signal based on the control signal and the PN signal, wherein the dither signal varies based on an amplitude level of the analog input signal, and wherein the dither DAC to set a strength of the dither signal based on the detected amplitude level.

* * * * *